US012315810B2

(12) United States Patent
Sarkar

(10) Patent No.: US 12,315,810 B2
(45) Date of Patent: May 27, 2025

(54) INTEGRATED ASSEMBLIES HAVING GRAPHENE-CONTAINING-STRUCTURES

(71) Applicant: Micron Technology, Inc., Boise, ID (US)

(72) Inventor: Santanu Sarkar, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 197 days.

(21) Appl. No.: 18/143,027

(22) Filed: May 3, 2023

(65) Prior Publication Data

US 2023/0307367 A1    Sep. 28, 2023

Related U.S. Application Data

(62) Division of application No. 17/375,345, filed on Jul. 14, 2021, now Pat. No. 11,682,623.

(51) Int. Cl.
| | |
|---|---|
| *H01L 23/532* | (2006.01) |
| *H01L 21/768* | (2006.01) |
| *H10D 48/01* | (2025.01) |
| *H10D 62/80* | (2025.01) |
| *H10D 62/83* | (2025.01) |
| *H10D 86/40* | (2025.01) |

(52) U.S. Cl.
CPC .. *H01L 23/53276* (2013.01); *H01L 23/53261* (2013.01); *H01L 23/5329* (2013.01); *H10D 48/01* (2025.01); *H10D 62/8303* (2025.01); *H10D 62/882* (2025.01); *H10D 86/425* (2025.01); *H01L 21/76807* (2013.01); *H01L 21/76843* (2013.01)

(58) Field of Classification Search
None
See application file for complete search history.

(56) References Cited

U.S. PATENT DOCUMENTS

| | | | |
|---|---|---|---|
| 7,958,127 B2 | 6/2011 | Edmonds et al. | |
| 2012/0006580 A1* | 1/2012 | Sandhu | ............ H01L 21/76865 977/734 |
| 2015/0137377 A1 | 5/2015 | Bao et al. | |

(Continued)

FOREIGN PATENT DOCUMENTS

| | | |
|---|---|---|
| CN | 106847790 | 6/2017 |
| WO | WO 2021/132010 | 7/2021 |
| WO | WO PCT/US2022/033431 | 10/2022 |

OTHER PUBLICATIONS

Bae et al., "Roll-to-Roll Production of 30-Inch Graphene Films for Transparent Electrodes", Nature Nanotechnology vol. 5, 2010, United Kingdom, pp. 574-578.

(Continued)

*Primary Examiner* — Katie L. Hammer
(74) *Attorney, Agent, or Firm* — Wells St. John P.S.

(57) ABSTRACT

Some embodiments include an integrated assembly having a first graphene-containing-material offset from a second graphene-containing-material. The first graphene-containing-material includes a first graphene-layer-stack with first metal interspersed therein. The second graphene-containing-material includes a second graphene-layer-stack with second metal interspersed therein. A conductive interconnect couples the first and second graphene-containing materials to one another.

20 Claims, 6 Drawing Sheets

(56) References Cited

U.S. PATENT DOCUMENTS

| | | | | |
|---|---|---|---|---|
| 2015/0145135 | A1* | 5/2015 | Sandhu | ............ H01L 21/76805 257/758 |
| 2016/0056384 | A1 | 2/2016 | Barth | |
| 2017/0271594 | A1 | 9/2017 | Barth | |
| 2017/0358486 | A1 | 12/2017 | Ham et al. | |
| 2018/0151487 | A1* | 5/2018 | Venugopal | ............ H01L 21/288 |
| 2020/0035602 | A1 | 1/2020 | Nam et al. | |
| 2020/0350252 | A1 | 11/2020 | Shin et al. | |
| 2022/0359414 | A1* | 11/2022 | Li | .................... H01L 21/76837 |

OTHER PUBLICATIONS

Banerjee, "Challenges and Applications of Emerging Nonvolatile Memory Devices", Electronics 9, 2020, Switzerland, 24 pages.

Chiodarelli et al., "Integration and electrical Characterization of Carbon Nanotube via Interconnects", Microelectronic Engineering vol. 88, Issue 5, May 2011, Netherlands, pp. 837-843.

IDTechEx, "CVD Graphene for Electronic Applications: 2021 Status and Outlook from IDTechEx", available online at https://www.prnewswire.com/news-releases/cvd-graphene-for-electronic-applications-2021-status-and-outlook-from-idtechex-301226125.html, Feb. 2021, 4 pages.

Lin et al., "100-GHz Transistors from Wafer-Scale Epitaxial Graphene", Science 327, 2010, United States, p. 662.

Liu et al., "Environmentally Stable Macroscopic Graphene Film with Specific Electrical Conductivity Exceeding Metals", Carbon vol. 156, Sep. 2019, United Kingdom, pp. 205-211.

Liu et al., "Hexahapto-Chromium Complexes of Graphene: A Theoretical Study", RSC Advances 4, 2014, United Kingdom, 28640-28644.

Lu et al., "Charge Transfer Doping of Graphene Without Degrading Carrier Mobility", AIP Journal of Applied Physics 121, 2017, United States, 10 pages.

Nantero, "Advancements in Nanotechnology", available online at http://nantero.com/technology/, 2021, 3 pages.

Neto et al., "The Electronic Properties of Graphene", Reviews of Modern Physics 81, 2009, United States, 55 pages.

Quizlet, "Flashcards—Bohr Model S,P,D,F Orbitals", available online at https://quizlet.com/312256102/bohr-model-spdf-orbitals-flash-cards/, 2020, 1 page.

Rizzi et al., "Electrical Conductivity Modeling of Graphene-Based Conductor Materials", ACS Applied Materials & Interfaces 10, 49, 2018, United States, pp. 43088-43094.

Stobinski, "Nanomaterials LS—About Graphene", available online at http://www.nanomaterials.pl/graphene, 2020, 2 pages.

Wang et al., "Towards Understanding the Salt-Intercalation Exfoliation of Graphite into Graphene", RSC Advances 7, 2017, United Kingdom, pp. 52252-52260.

Wikipedia, "Bis(benzene)chromium", available online at https://en.wikipedia.org/wiki/Bis(benzene)chromium, Jan. 2021, 2 pages.

Xie et al., "Carbon Nanotube Growth for Through Silicon via Application", Nanotechnology vol. 24, 2013, United Kingdom, 7 pages.

* cited by examiner

INTEGRATED ASSEMBLIES HAVING GRAPHENE-CONTAINING-STRUCTURES

RELATED PATENT DATA

This application resulted from a divisional of U.S. patent application Ser. No. 17/375,345 filed Jul. 14, 2021, which is hereby incorporated by reference herein.

TECHNICAL FIELD

Integrated assemblies (e.g., integrated memory, etc.) have graphene-containing-structures.

BACKGROUND

FIG. 1 diagrammatically illustrates a prior art arrangement of graphene 200. The graphene comprises horizontally-extending layers (planes, sheets) 202, and comprises regions 204 between the layers. Graphene may have high electrical conductivity along individual layers 202 (i.e., high in-plane conductivity), and poor electrical conductivity across the regions 204 between the layers 202 (i.e., poor out-of-plane conductivity).

Graphene has many properties that may make it suitable for use in integrated assemblies, but the poor out-of-plane conductivity of graphene is problematic for many of the applications pertaining to integrated assemblies. Accordingly, it is desired to develop improved graphene-containing-materials having out-of-plane conductivity suitable for use in integrated assemblies. It is further desired to develop integrated assemblies utilizing the improved graphene-containing-materials.

DETAILED DESCRIPTION OF THE ILLUSTRATED EMBODIMENTS

Some embodiments include graphene-containing-material which has transition metal provided between graphene planes to improve out-of-plane-conductivity. Some embodiments include integrated assemblies incorporating such graphene-containing-material. Example embodiments are described with reference to FIGS. 2-6.

Figure 1:
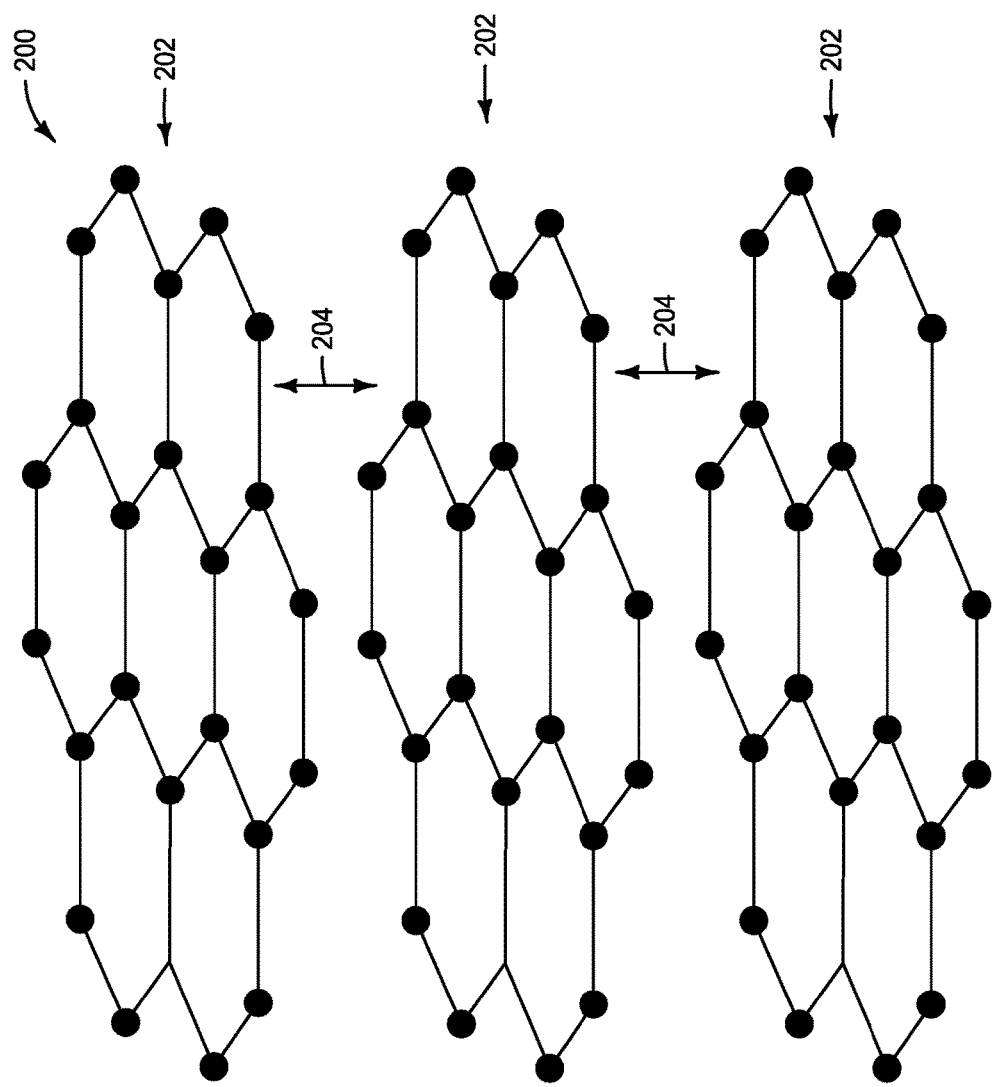
FIG. 1 is a diagrammatic view of a prior art arrangement of graphene.
Figure 2:
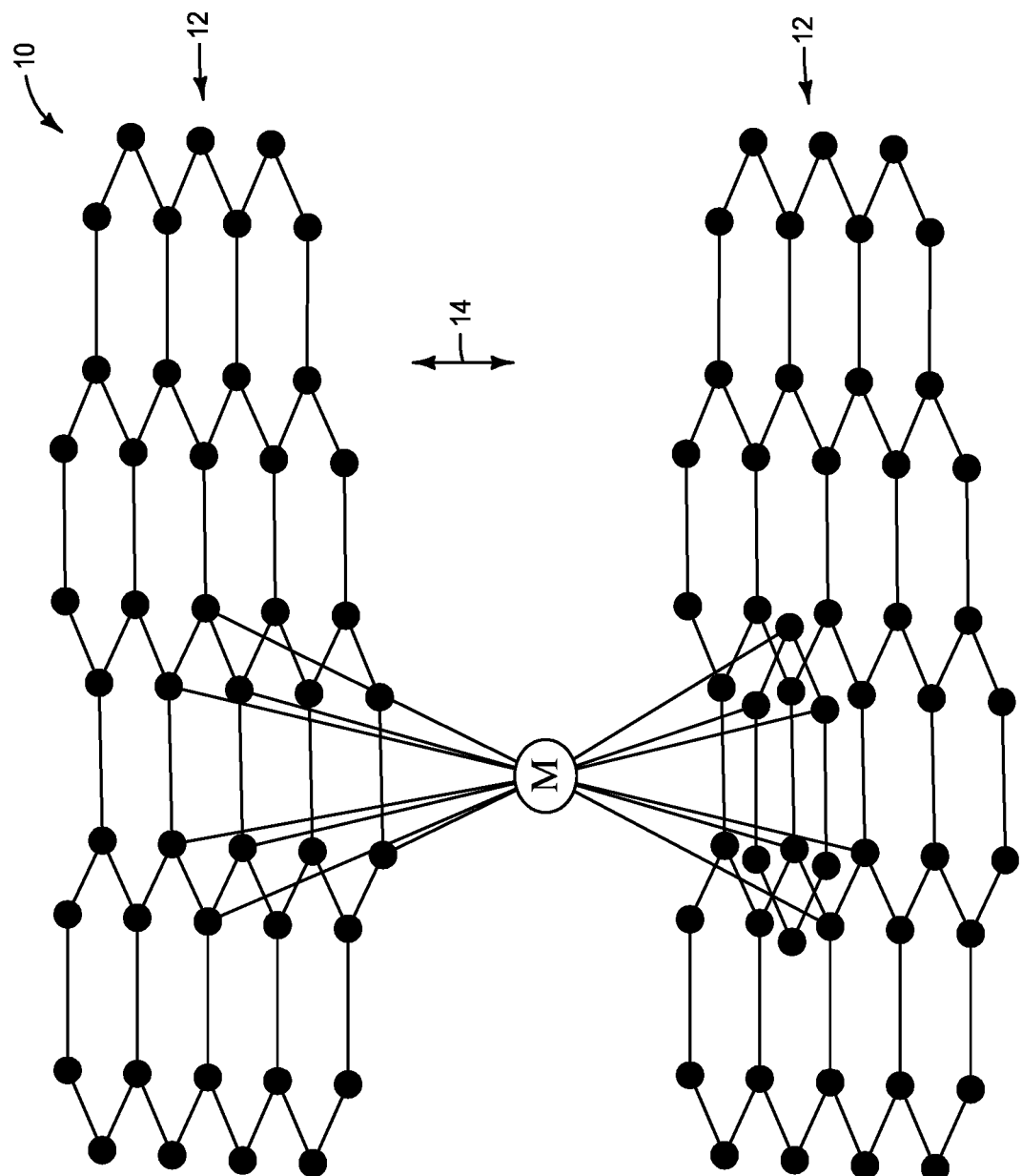
FIG. 2 is a diagrammatic view of graphene modified in accordance with example embodiments.

FIG. 2 diagrammatically illustrates a region of an example graphene-containing-material 10 in accordance with an example embodiment. The material 10 includes layers (planes, sheets) 12 analogous to the layers 202 described above with reference to FIG. 1. A region 14 is between the layers 12. A metal, M, is provided within the region 14 to provide a conductive bridge between the layers 12 and to thereby improve out-of-plane conductivity of the material 10 as compared to the prior art graphene 200 of FIG. 1.

The layers 12 may be representative of a large number of graphene layers (planes, sheets) within the material 10, and the metal M may be representative of a large number of metals (metal species) provided between the layers 12 of the material 10. The metal M within the material 10 may be the same metal (metal species) throughout the material 10, or may comprise two or more different metals (metal species). In some embodiments, the metal within the material 10 may be one or more transition metals (transition elements), with the term "transition metal" being understood to comprise the elements of groups 3-12 of the periodic table, including the elements of the lanthanide series and the actinide series. In some embodiments, the metal M may be considered to correspond to conductive inter-planar material provided within the regions 14 between the planes (sheets, layers) 12, with such inter-planar material comprising one or more elements of groups 3-12 of the periodic table.

In some embodiments, the layers 12 may be considered to form a graphene-layer-stack, and the metal M may be considered to represent one or more elements of groups 3-12 of the periodic table which are interspersed between graphene layers of the graphene-layer-stack.

In some embodiments, the metal species may be chosen such that d orbitals from the metal species may overlap with pi orbitals of the carbon atoms of the graphene layers, and in some embodiments may even form covalent hexahapto ($\eta^6$) bonds with the pi orbitals, where the Greek letter $\eta$ ('eta') indicates hapticity. For instance, the metal species may include one or more of Y, Sc, Cr, Mo, W, etc.

In some embodiments, the metal species may be chosen such that f orbitals from the metal species may overlap with pi orbitals of the carbon atoms of the graphene layers, and in some embodiments may even form covalent hexahapto ($\eta^6$) bonds with the pi orbitals. For instance the metal species may include one or more of elements selected from the actinide series and the lanthanide series, and may, for example, comprise one or more of La, Ce, Pr, Nd, Pm, Sm, Gd, Dy, Yb, Lu and Ac.

The graphene material 10 of FIG. 2 may be utilized in integrated assemblies. Example integrated assemblies are described with reference to FIGS. 3-6.

Figure 3:
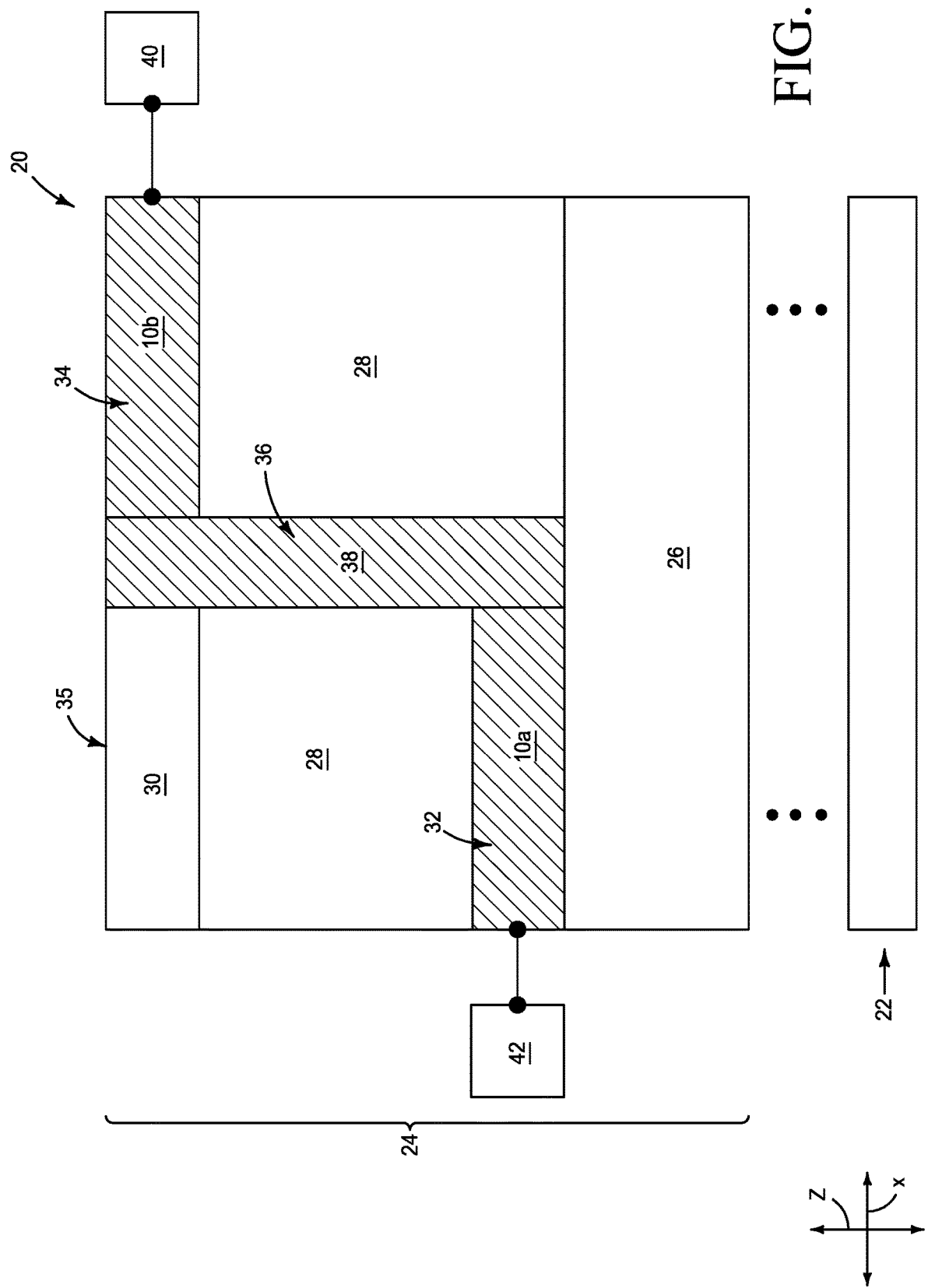
FIGS. 3-6 are diagrammatic cross-sectional side views of example integrated arrangements.

Referring to FIG. 3, such shows an integrated assembly 20 comprising a base 22 supporting a construction 24.

The base 22 may comprise semiconductor material, and may, for example, comprise, consist essentially of, or consist of monocrystalline silicon. The base 22 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 22 may correspond to a semiconductor substrate containing one or more materials associated with integrated circuit fabrication. Such materials may include, for example, one or more of refractory metal materials, barrier materials, diffusion materials, insulator materials, etc.

The construction 24 includes a first insulative material 26, a second insulative material 28 over the first insulative material, and a third insulative material 30 over the second insulative material.

In some embodiments, the first insulative material 26 may be a low-k dielectric material, with the term low-k meaning a dielectric constant less than that of silicon dioxide (e.g., less than about 3.9). The low-k dielectric material may include any suitable composition(s), and in some embodiments may comprise, consist essentially of, or consist of one or more porous silicon dioxide, carbon-doped silicon dioxide, etc.

The second insulative material 28 may comprise any suitable composition(s), and in some embodiments may comprise, consist essentially of, or consist of one or more of silicon dioxide, silicon nitride, silicon oxynitride, etc. In some embodiments, the second insulative material 28 may be a spin-on glass.

The third insulative material 30 may comprise any suitable composition(s), and in some embodiments may comprise, consist essentially of, or consist of one or more of silicon dioxide, silicon nitride, silicon oxynitride, etc. In some embodiments, the third insulative material 30 may be a spin-on glass.

Two or more of the first, second and third insulative materials 26, 28 and 30 may be the same composition as one another. Alternatively, two or more of the first, second and third insulative materials may be different compositions relative to one another.

A first graphene-containing-structure 32 is supported by the first insulative material 26, and a second graphene-containing-structure 34 is offset from the first graphene-containing-structure and is supported by the second insulative material 28. In the illustrated embodiment, the second graphene-containing-structure 34 is shown to be both elevationally offset and laterally offset from the first graphene-containing-structure 32. In other embodiments, the second graphene-containing-structure 34 may be directly over the first graphene-containing-structure 32 so that it is elevationally offset without being vertically offset, or may be horizontally adjacent to the first graphene-containing-structure 32 so that is laterally offset without being elevationally offset.

The first graphene-containing-structure 32 is laterally adjacent to a region of the second insulative material 28, and may be considered to be within the second insulative material. Similarly, the second graphene-containing-structure 34 is laterally adjacent to a region of the third insulative material 30, and may be considered to be within the third insulative material.

The first and second graphene-containing-structures 32 and 34 comprise first and second graphene-containing-materials 10a and 10b, respectively. Such materials may be analogous to the material 10 described above with reference to FIG. 2, and accordingly may comprise graphene layers (sheets, planes) 12, and transition metal within regions 14 between the layers. The materials 10a and 10b may be compositionally the same as one another (e.g., may comprise the same transition metal(s) to the same concentration), or may be compositionally different from another (e.g., may comprise different transition metals relative to one another, and/or may comprise a different concentration of transition metal(s) relative to one another).

In some embodiments, the first material 10a may be considered to comprise first graphene planes (analogous to the planes 12 of FIG. 2), and to include first transition metal interspersed between the first graphene planes. The first transition metal may comprise one or more of the species described above as being suitable for the metal within the material 10 of FIG. 2, and accordingly may comprise one or more of the elements selected from groups 3-12 of the periodic table, including the elements within the lanthanide series and the actinide series. The first graphene planes may have any suitable orientation, and in some embodiments may extend laterally along a first direction corresponding to an illustrated x-axis direction. In the illustrated embodiment, the structure 32 also extends laterally along the x-axis direction. In other embodiments, the structure 32 may extend along a different direction either in addition to, or alternatively to, the illustrated x-axis direction.

In some embodiments, the second material 10b may be considered to comprise second graphene planes (analogous to the planes 12 of FIG. 2), and to include second transition metal interspersed between the second graphene planes. The second transition metal may comprise one or more of the species described above as being suitable for the metal within the material 10 of FIG. 2, and accordingly may comprise one or more of the elements selected from groups 3-12 of the periodic table, including the elements within the lanthanide series and the actinide series. The second graphene planes may have any suitable orientation, and in some embodiments may extend laterally along the first direction corresponding to the illustrated x-axis direction. In the illustrated embodiment, the structure 34 also extends laterally along the x-axis direction. In other embodiments, the structure 34 may extend along a different direction either in addition to, or alternatively to, the illustrated x-axis direction.

In some embodiments, the first and second transition metals within the first and second materials 10a and 10b, respectively, may be the same as one another (e.g., may comprise the same element(s) as one another), and in other embodiments the first and second transition metals within the first and second materials 10a and 10b, respectively, may be different from one another (e.g., may comprise different elements relative to one another).

In some embodiments, the graphene layers within the first material 10a may be considered to be configured as a first graphene-layer-stack, and the graphene layers within the second material 10b may be considered to be configured as a second graphene-layer-stack.

A conductive interconnect 36 extends through the insulative materials 28 and 30, and electrically couples the first and second graphene-containing-structures 32 and 34 with one another. The interconnect 36 comprises a conductive material 38. The conductive material 38 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the interconnect 36 may comprise one or more metals; and may, for example, comprise, consist essentially of, or consist of one or more of titanium nitride, tungsten nitride, titanium and tungsten.

In the illustrated embodiment, the interconnect 36 extends vertically along an illustrated z-axis. In other embodiments, the interconnect 36 may extend along a different direction (e.g., may extend along a vertical direction which is tipped from being along the illustrated z-axis).

The construction 20 may be formed with any suitable processing. For instance the graphene-containing-material 10a may be formed over an upper surface of the insulative material 26 with a spin-on process and/or other suitable processing, and may be patterned into the structure 32. Subsequently, the insulative material 28 may be formed over the structure 32, and the graphene-containing-material 10b may be formed over an upper surface of the material 28 and patterned into the structure 34. The material 10b may be formed with any suitable processing, including, for example, a spin-on process. Next, the insulative material 30 may be formed over the structure 34, and an opening may be formed through one or more of the materials 10a, 28, 10b and 30 to define a location of the conductive interconnect 36. The conductive material 38 may be formed within the opening, and then planarization may be conducted to form the planarized upper surface 35 and finish the illustrated construction 20.

The conductive structures 32, 36 and 34 may be utilized for coupling integrated circuit elements with one another. For instance, a pair of circuit devices (circuit components, circuit elements, etc.) 40 and 42 are shown in FIG. 3, with such devices being vertically offset relative to one another. The first device 40 is electrically coupled with the conductive structure 34, and the second device 42 is electrically coupled with the conductive structure 32. The conductive structures 34, 36 and 32 together form a conductive path which couples the circuit devices 40 and 42 with one another. The devices 40 and 42 may comprise any suitable devices of an integrated assembly. For instance the device 40 may comprise, for example, a wordline, digit line, etc., associated with a memory array; may comprise a sensor; may comprise a component of a multiplexer (mux), etc. The device 42 may comprise, for example, a component of CMOS circuitry, such as, for example, a component of a wordline-driver-circuit, a component of a sense-amplifier-circuit, etc.

Figure 4:
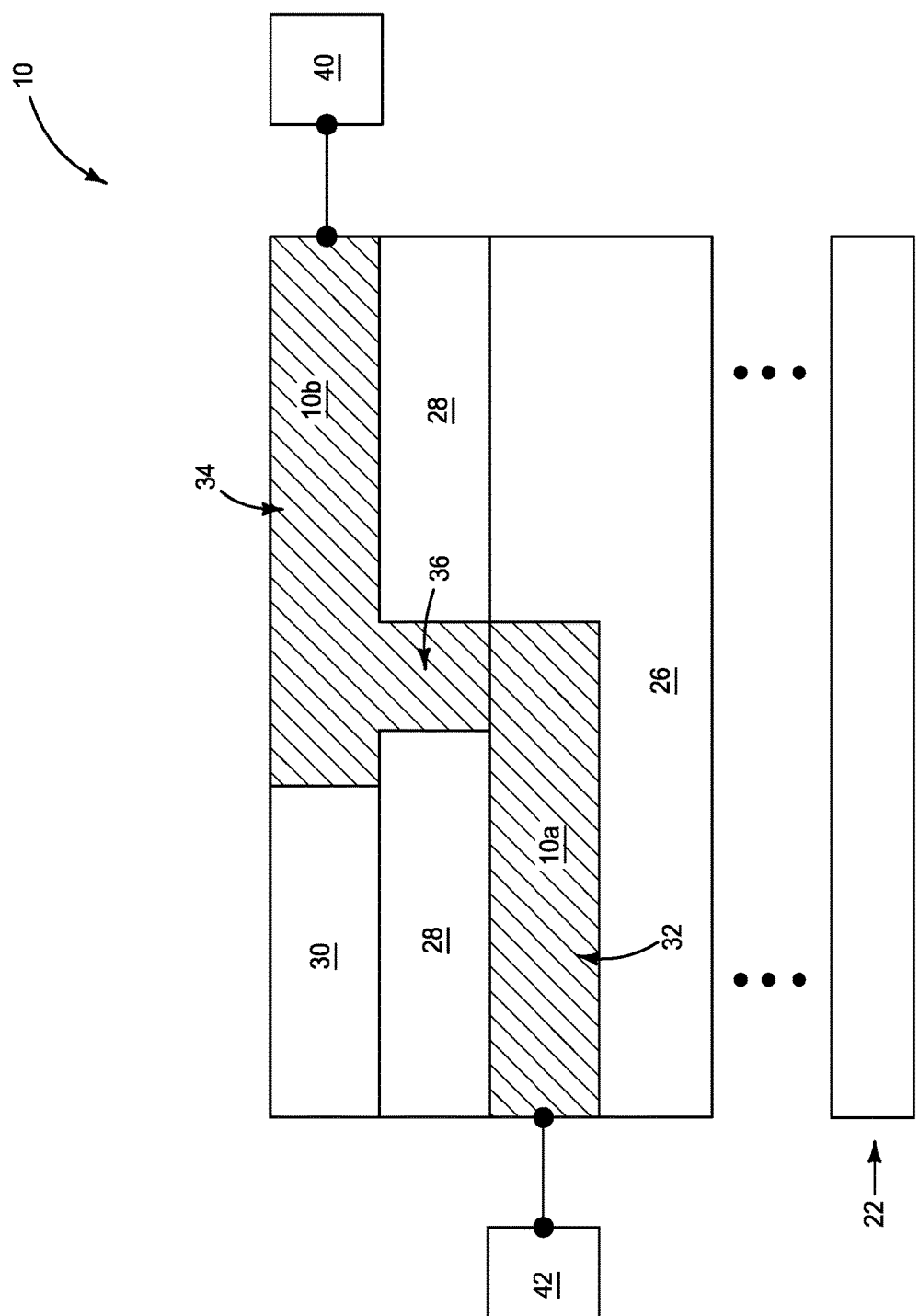

FIG. 4 shows an embodiment similar to that of FIG. 3, except that the conductive interconnect 36 comprises the graphene-containing-material 10b of the graphene-containing-structure 34. In some embodiments, the insulative materials 26 and 30 of FIG. 4 may both be low-k materials, and may be referred to as first and second low-k dielectric materials, respectively. The first and second low-k dielectric materials 26 and 30 may or may not comprise the same composition as one another.

The configuration of FIG. 4 may be formed with any suitable processing. For instance, the first graphene-containing-structure 32 may be formed with processing analogous to that described above with reference to FIG. 3. Subsequently, the materials 28 and 30 may be formed over the materials 10a and 26, and patterned to form an opening suitable for formation of a configuration which will comprise both the conductive structure 34 and the interconnect 36. Next, the material 10b may be formed within the opening and patterned utilizing a damascene-type process.

The first graphene-containing-structure 32 of FIG. 4 is laterally adjacent to a region of the first insulative material 26, and may be considered to be within the first insulative material. Similarly, the second graphene-containing-structure 34 is laterally adjacent to a region of the third insulative material 30, and may be considered to be within the third insulative material.

Figure 5:
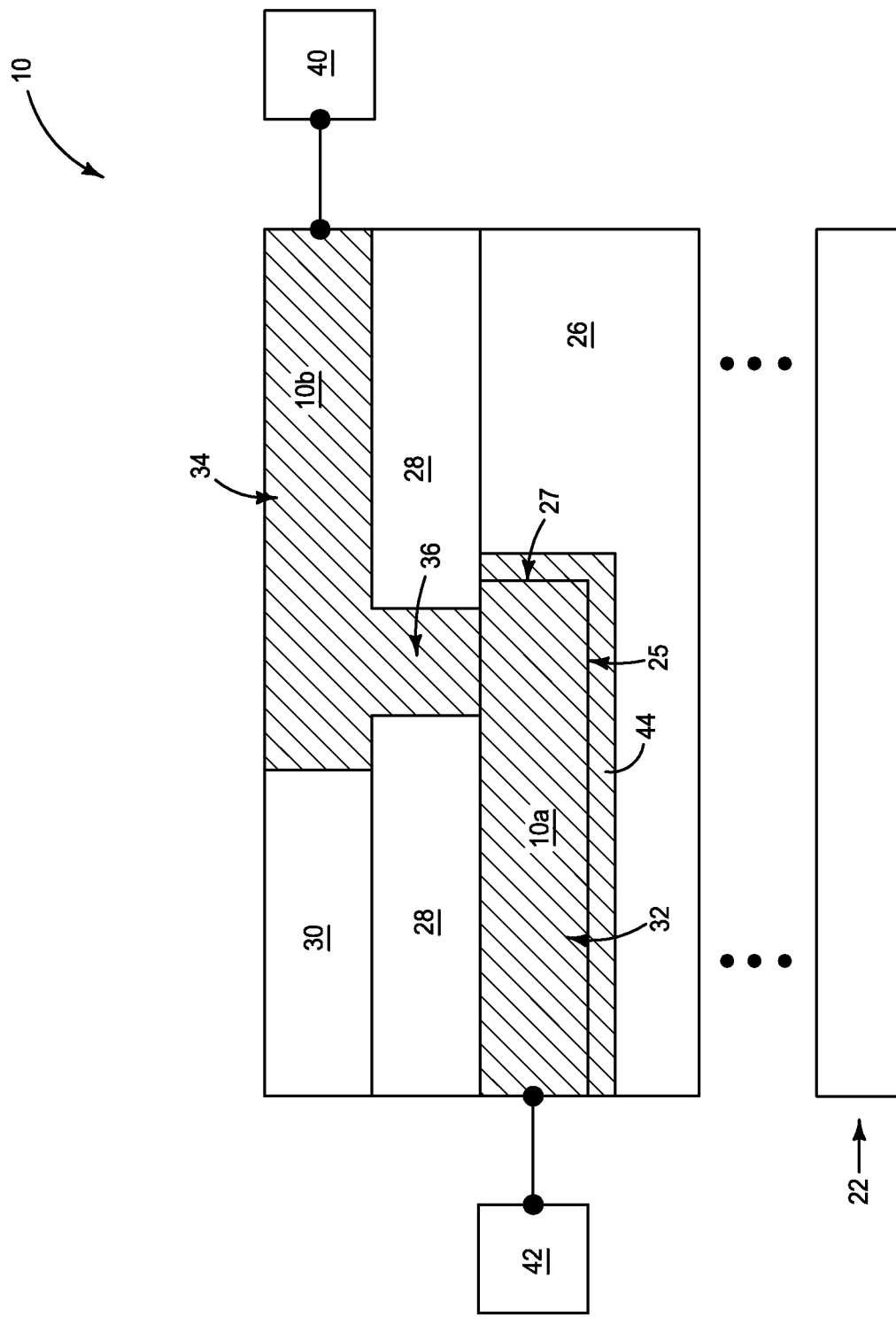

FIG. 5 shows a configuration analogous that of FIG. 4, but shows an optional barrier material 44 which may be provided between the graphene-containing-material 10a and the insulative material 26. The barrier material may be conductive or insulative, and in the illustrated embodiment is shown to be a conductive material. The barrier material may be homogeneous, or may be a laminate of two or more different materials. If the barrier material is a laminate, one or more of the materials of the laminate may be insulative while one or more of the materials of the laminate are conductive, all of the materials of the laminate may be conductive, all of the materials of the laminate may be insulative, one or more of the materials of the laminate may be semiconductive, all of the materials of the laminate may be semiconductive, etc.

In some embodiments, the barrier material may comprise one or more metals, such as, for example, one or more of titanium, tungsten, titanium nitride, tungsten nitride, etc. The barrier material may be utilized to improve adhesion between the graphene-containing-material 10a and the insulative material 26.

The barrier material 44 may be considered to line a bottom 25 and a lateral sidewall 27 of the structure 32 comprising the material 10a, or alternatively may be considered to be part of the structure 32.

Figure 6:
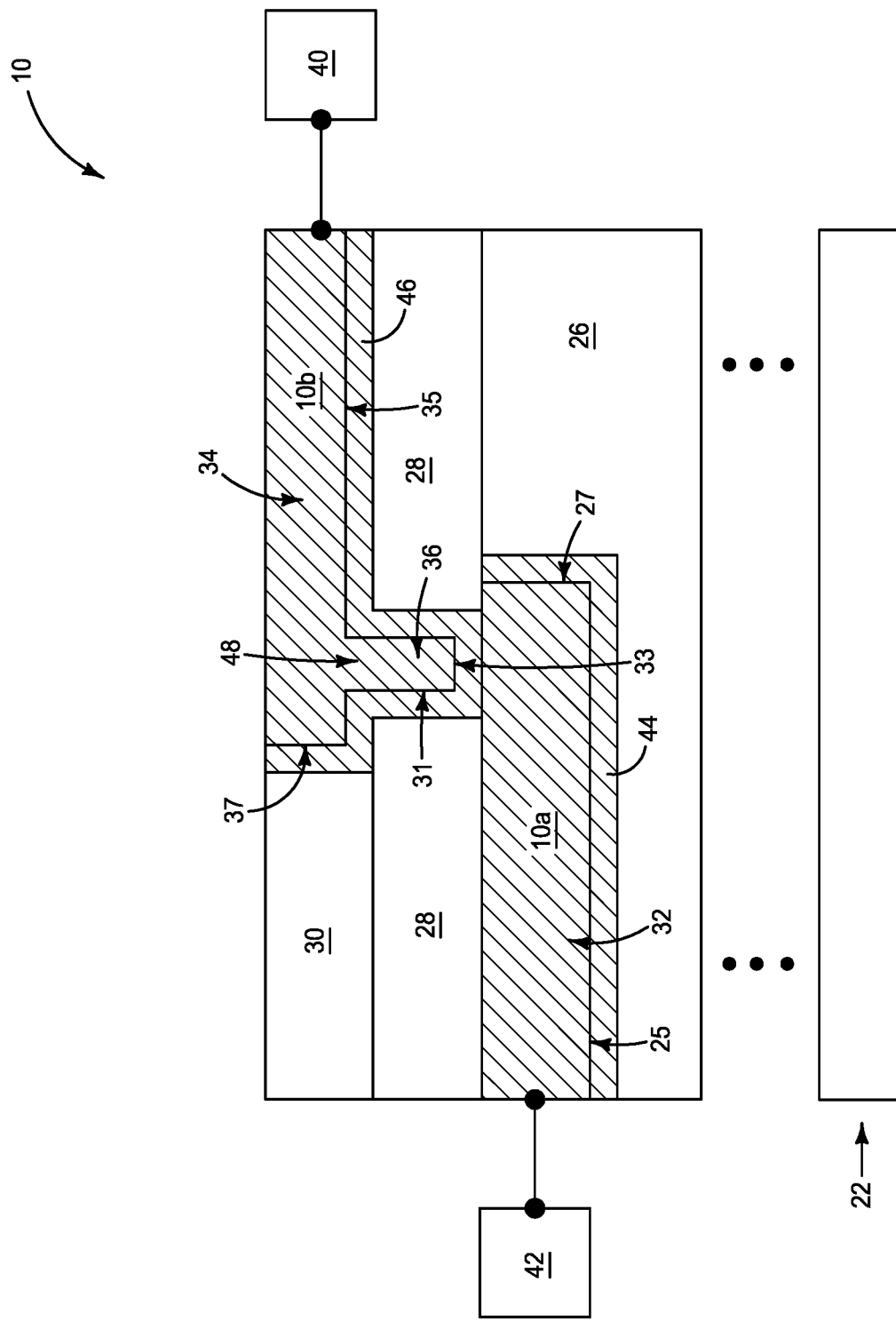

FIG. 6 shows a configuration analogous to that of FIG. 5, and shows a second barrier material 46 between the graphene-containing-material 10b and the insulative materials 28 and 30. The second barrier material 46 may be considered to line a sidewall 31 and a bottom 33 of the interconnect 36, or alternatively to be part of the interconnect 36. Also the second barrier material 46 may be considered to line a bottom 35 of the structure 34 as well as a lateral periphery 37 of the structure 34, or alternatively to be part of the structure 34.

In some embodiments, the conductive interconnect 36 of FIG. 6 may be considered to have an inner region 48 comprising the material 10b, and to comprise a metal-containing material 46 along the edges 31 and 33 of such inner region.

The embodiments described herein may enable graphene-containing-structures to be incorporated into integrated assemblies by configuring such structures to have suitable conductivity both in inter-plane and intra-plane throughout the structures.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a second graphene-containing-material offset from a first graphene-containing-material. The first graphene-containing-material includes a first graphene-layer-stack with first metal interspersed therein. The second graphene-containing-material includes a second graphene-layer-stack with second metal interspersed therein. A conductive interconnect couples the first and second graphene-containing materials to one another.

Some embodiments include an integrated assembly having a first insulative material supported by a semiconductor substrate, and a second insulative material over the first insulative material. A first graphene-containing-material is within the second insulative material and is supported by the first insulative material. The first graphene-containing-material includes a plurality of first graphene planes and includes first metal interspersed between the first graphene planes. A second graphene-containing-material is supported by the second insulative material. The second graphene-containing-material includes a plurality of second graphene planes and includes second metal interspersed between the second graphene planes. A conductive interconnect couples the first graphene-containing-material with the second graphene-containing-material.

Some embodiments include an integrated assembly having a first low-k dielectric material supported by a semiconductor substrate, an insulative material over the first low-k dielectric material, and a second low-k dielectric material over the insulative material. A first graphene-containing-structure is within the first low-k dielectric material. The first graphene-containing-structure includes a first material which comprises a plurality of first graphene planes and which comprises first metal interspersed between the first graphene planes. A second graphene-containing-structure is within the second low-k dielectric material. The second graphene-containing-structure includes a second material which comprises a plurality of second graphene planes and which comprises second metal interspersed between the second graphene planes. A conductive interconnect couples the first graphene-containing-structure with the second graphene-containing-structure. The conductive interconnect comprises the second material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. An integrated assembly, comprising:
   a first insulative material supported by a semiconductor substrate;
   a second insulative material over the first insulative material;
   a first graphene-containing-material supported by the first insulative material; the first graphene-containing-material including a first stack of multiple first graphene planes and including first metal interspersed between the first graphene planes within the first stack;
   a second graphene-containing-material supported by the second insulative material; the second graphene-containing-material including a second stack of multiple second graphene planes and including second metal interspersed between the second graphene planes within the second stack; and
   a conductive interconnect coupling the first graphene-containing-material with the second graphene-containing-material.

2. The integrated assembly of claim 1 wherein the first insulative material is a low-k dielectric material.

3. The integrated assembly of claim 1 wherein the first insulative material comprises porous silicon dioxide.

4. The integrated assembly of claim 1 wherein the second insulative material comprises one or more of silicon dioxide, silicon nitride and silicon oxynitride.

5. The integrated assembly of claim 1 wherein the first and second metals include one or more transition elements.

6. The integrated assembly of claim 1 wherein the first and second metals include one or more elements which are not in the lanthanide series or the actinide series.

7. The integrated assembly of claim 1 wherein the first and second metals include one or more elements which are in the lanthanide series or the actinide series.

8. The integrated assembly of claim 1 wherein the first and second metals are the same as one another.

9. The integrated assembly of claim 1 wherein the first and second metals are different from one another.

10. The integrated assembly of claim 1 wherein the conductive interconnect comprises one or more metals.

11. The integrated assembly of claim 1 wherein the first and second graphene-containing-materials extend laterally along a first direction along a cross-section; and wherein the first and second graphene planes also extend along the first direction.

12. An integrated assembly, comprising:
   a first low-k dielectric material supported by a semiconductor substrate;
   an insulative material over the first low-k dielectric material;
   a second low-k dielectric material over the insulative material;
   a first graphene-containing-structure within the first low-k dielectric material; the first graphene-containing-structure including a first stack of a plurality of first graphene planes with a first metal interspersed between the first graphene planes within the first stack;

a second graphene-containing-structure within the second low-k dielectric material; the second graphene-containing-structure including a second stack of a plurality of second graphene planes and a second metal interspersed between the second graphene planes within the second stack; and a conductive interconnect coupling the first graphene-containing-structure with the second graphene-containing-structure; the conductive interconnect comprising the second material.

13. The integrated assembly of claim 12 comprising a barrier material between the first graphene-containing-structure and the first low-k dielectric material.

14. The integrated assembly of claim 13 wherein the barrier material is conductive.

15. The integrated assembly of claim 13 wherein the barrier material comprises one or more metals.

16. The integrated assembly of claim 12 comprising a barrier material between the second graphene-containing-structure and the second low-k dielectric material.

17. The integrated assembly of claim 16 wherein the barrier material is conductive.

18. The integrated assembly of claim 16 wherein the barrier material comprises one or more metals.

19. The integrated assembly of claim 12 wherein the first and second metals include one or more transition elements.

20. The integrated assembly of claim 12 wherein the conductive interconnect includes a metal-containing barrier material between the second material and the first graphene-containing-structure.

\* \* \* \* \*